United States Patent
Sugiura et al.

(10) Patent No.: US 6,581,283 B2
(45) Date of Patent: Jun. 24, 2003

(54) METHOD FOR FORMING PIN-FORM WIRES AND THE LIKE

(75) Inventors: Kazuo Sugiura, Akishima (JP); Hirofumi Moroe, Musashimurayama (JP); Fumihiko Kato, Fussa (JP); Yasuyuki Komachi, Akishima (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 230 days.

(21) Appl. No.: 09/729,041

(22) Filed: Dec. 4, 2000

(65) Prior Publication Data
US 2001/0002607 A1 Jun. 7, 2001

(30) Foreign Application Priority Data
Dec. 2, 1999 (JP) .......................... 11-342996

(51) Int. Cl.$^7$ .............................. H01R 9/00; H05K 3/00
(52) U.S. Cl. .............................. 29/843; 29/840; 29/850; 228/4.5; 228/180.5
(58) Field of Search ................. 29/840, 850, 843; 228/1.1, 4.5, 110.1, 180.5; 174/261–263, 259

(56) References Cited

U.S. PATENT DOCUMENTS

| 4,955,523 A | * | 9/1990 | Carlommagno et al. | 219/56.21 |
| 5,014,419 A | * | 5/1991 | Cray et al. | 29/830 |
| 6,206,273 B1 | * | 3/2001 | Beaman et al. | 219/106 |

* cited by examiner

Primary Examiner—Rick Kiltae Chang
(74) Attorney, Agent, or Firm—Koda & Androlia

(57) ABSTRACT

A method for forming pin-form wires or bumps on, for instance, an electrode pad of an electronic circuit element, in which a ball is formed on a tip end of a wire that passes through a capillary, the wire is then extended from the lower end of the capillary, a notch is formed in the portion of the wire between the ball and the capillary by a cutter, the ball is bonded to the electrode pad using the capillary, and the capillary is raised, thus pulling the wire and cutting the wire at the notch to form a pin-form wire or bump on the electrode pad.

4 Claims, 2 Drawing Sheets

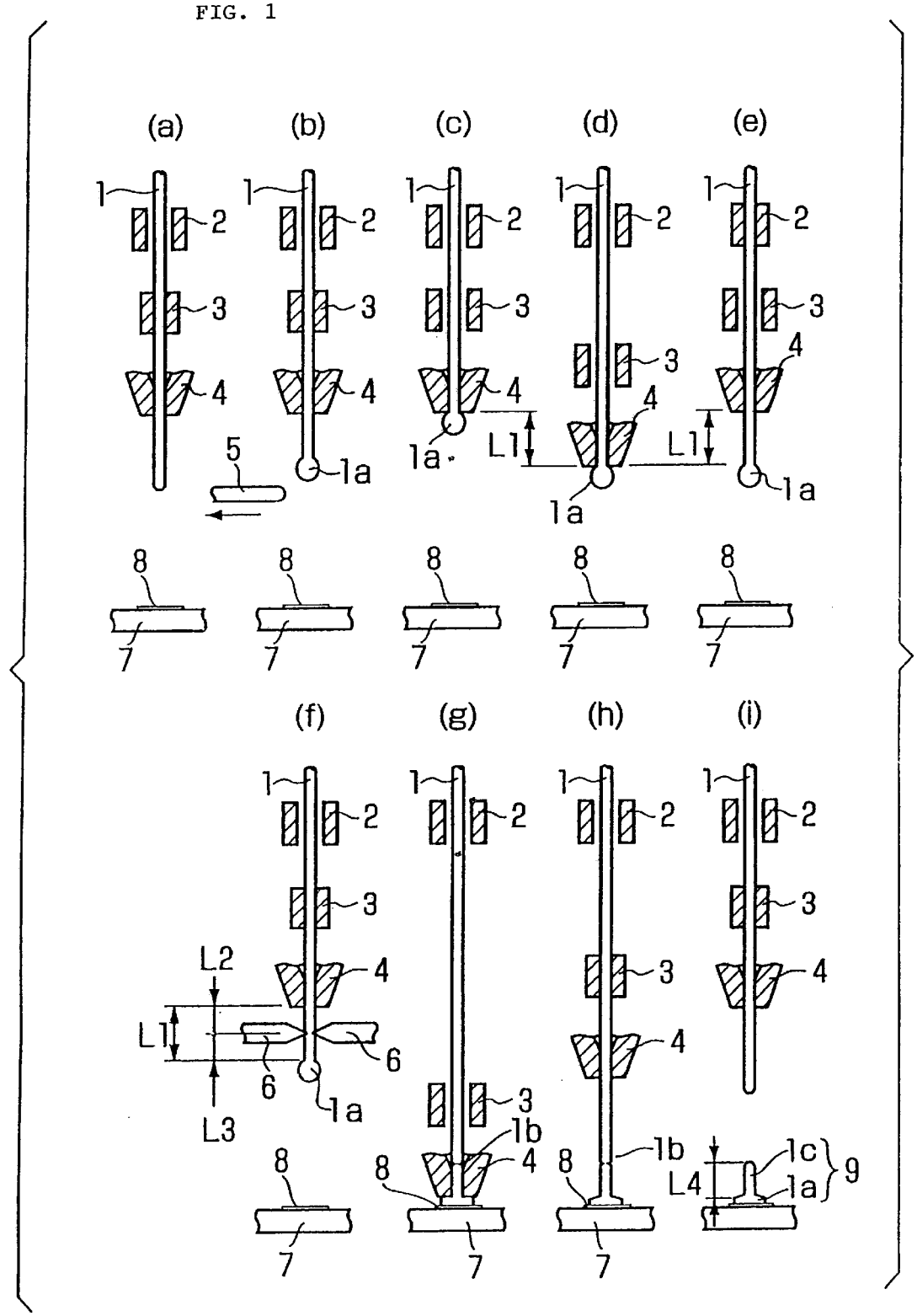

METHOD FOR FORMING PIN-FORM WIRES AND THE LIKE

BACKGROUND OF THE INVENTION

1. Field of the Invention

The present invention relates to a method for forming pin-form wires and the like.

2. Prior Art

In wire bonding, a ball at the end of a bonding wire is bonded to, for instance, electrode pads of electronic circuit elements, etc; and wires that have been bonded are left on balls. Depending on the presence or absence of any wire or on the length of the wire, such wires are distinguished in two types: pin-form wires and bumps. This distinction is, however, not very strict. Wires having the length of, for instance, 100 to 500 $\mu$m, are referred to as pin-form wires, while those having the length shorter than this are referred to as bumps.

Conventional method for forming pin-form wires or bumps is described in, for instance, Japanese Patent Application Laid-Open (Kokai) No. H10-135220. The title of this prior art invention is "A method for forming bumps." However, since wires that are formed or remain on the balls bonded to the electrode pads of an electronic circuit element, etc. in this prior art have a certain length, this method can be viewed as a method for forming pin-form wires.

In this prior art, a ball is formed on the tip end of a wire that passes through a capillary, and the ball is bonded to an electrode pad of an electronic circuit element, etc. using the capillary. Then, the capillary is raised by a fixed amount, and the wire is cut at the lower end of the capillary in a position that is sufficiently away from the ball, thus forming a pin-form wire or bump on the electrode pad. In this prior art, pin-form wires or bumps are obtained as a result of one of the following cutting methods.

In the first method, the wire is cut by an electric discharge applied to the wire that is at the tip end portion of the capillary hole by a discharge electrode installed on one side of the capillary.

The second method uses a laser device installed on one side of the lower end of the capillary. The wire is cut by irradiating laser beams to the wire that is at the capillary-hole tip end portion.

In the third method, an air nozzle installed on one side of the tip end of the capillary is used. The wire is cut by blowing air onto the wire that is at the capillary-hole tip end portion.

The fourth method uses a capillary that is formed by a plurality of chucking pieces that can hold and release a wire or uses a capillary that has a tip end portion formed as a chucking part. A notch is formed in the wire that is at the capillary-hole tip end portion by the edge of such capillaries, and the wire is cut by applying a tensile force to the wire.

In the fifth method, a cutter is installed on the side of the capillary. The wire is cut by pressing this cutter against the wire that is at the capillary-hole tip end portion.

In the sixth method, strained portions created by cuts or press grooves, etc. are formed beforehand at equal intervals in the direction of length of the wire that passes through the capillary, and the wire is cut by applying a tensile force to the wire.

In the above-described first method, the wire is cut by applying an electric discharge to the wire at the tip end portion of the capillary hole; accordingly, the wire tends to melted by the discharge and rises into the capillary hole, causing clogging of the capillary hole.

In the second, third and fifth methods, a laser device, an air nozzle or a cutter is used. However, it is in fact difficult to install such a laser device, an air nozzle or a cutter in a small space that is between the ball bonded to the electrode pad and the capillary that is being raised and in which a portion of the wire having the length as short as 500 $\mu$m or less exists. Accordingly, these methods cannot be realized unless a certain length of wire between the ball and the capillary is secured. Furthermore, in cases where numerous pin-form wires or bumps are formed in a dense concentration on an electronic circuit element, etc., the cutting means such as laser devices, air nozzles, cutters, etc. will contact the pin-form wires or bumps. Thus, such cutting means cannot be installed.

In the fourth method, the capillary is formed as chucking pieces or a chucking part that can be freely opened and closed. However, the structure of the capillary generally affects the bondability in cases where ultrasonic bonding is performed. Accordingly, capillaries with a chucking structure are actually not suitable for use.

In the sixth method, it is necessary to form strained portions in the wire at equal intervals beforehand in the wire manufacturing process. Accordingly, the number of processes required for manufacturing the wire increases, causing high material costs. Furthermore, the diameter of the wire is generally extremely small, for instance, 20 to 50 $\mu$m, and a back tension is applied to the portion of the wire between the spool on which the wire is wound and the capillary. Accordingly, there is a danger that arbitrary strained portions of the wire that is present between the spool and the capillary will be broken by twisting or warping that occur in the wire as a result of this back tension. Moreover, the length of wire above the bonded ball is limited.

SUMMARY OF THE INVENTION

Accordingly, the object of the present invention is to provide a method for forming stable pin-form wires and the like (bumps) with a fixed length, in which the length of the wire above the ball bonded to an electronic circuit element, etc. can be arbitrarily set, in which there is no excessive increase in costs, and in which the length of pin-form wires can be fixed.

The above-object is accomplished by unique steps of the present invention wherein a ball is formed on the tip end of a wire that passes through a capillary, the wire is then extended from the lower end of the capillary, a notch is formed in the portion of the wire between the ball and the capillary by a notch-forming means, the ball is bonded to a bonding object such as an electrode pad of an electronic circuit element using the capillary, the capillary is then raised, and the wire is pulled upward so that the wire is cut at the notched portion, thus forming a pin-form wire or a bump.

The above object is further accomplished by unique steps of the present invention wherein, by way of using a wire bonding apparatus that has a first wire clamper that is movable in a vertical direction together with a capillary and a second wire clamper that is immovable in a vertical direction, a wire is set so as to pass through the second wire clamper, first wire clamper and capillary, a ball is formed on the tip end of the wire that passes through the capillary with the second clamper open and the first clamper closed, the first wire clamper is opened and the ball is caused to contact the lower end of the capillary by the action of the back tension applied to the wire, the capillary and the first wire clamper are lowered, the capillary and the first wire clamper are raised after the second wire clamper is closed, thus allowing the wire to extend from the lower end of the capillary, a notch is formed in the portion of the wire between the ball and the capillary by a notch-forming means with the first wire clamper closed and the second wire clamper open, the first wire clamper is opened, and the capillary and first wire clamper are lowered so that the ball is, using the capillary, bonded to a bonding object such as an electrode pad of an electronic circuit element, the capillary and first wire clamper are both raised, and the first wire clamper is closed during this raising action of the capillary and first wire clamper, thus pulling the wire upward to cut the wire at the notched portion, and forming a pin-form wire or a bump.

BRIEF DESCRIPTION OF THE DRAWINGS

FIG. 1 shows the process diagram that illustrate steps according to one embodiment of the method of the present invention for forming pin-form wires and the like;

DETAILED DESCRIPTION OF THE PREFERRED EMBODIMENTS

Figure 2A:
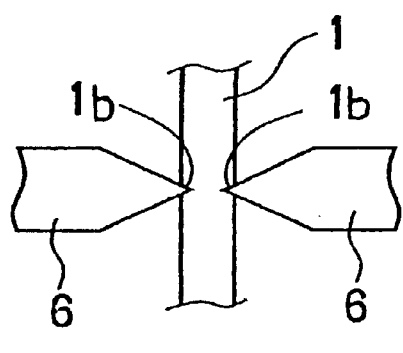
FIG. 2(*a*) is an enlarged view of essential parts in step (f) in FIG. 1, and FIG. 2(*b*) is a plan view of FIG. 2(*a*)

In step (a) as shown in FIG. 1, a wire 1 is first brought to pass through a capillary 4 via a second wire clamper 2 and first wire clamper 3 and is caused to extend from the lower end of the capillary 4. In this state, the second wire clamper 2 is open, and the first wire clamper 3 is closed, which are both provided in a bonding apparatus (not shown). The second wire clamper 2 is not movable upward or downward, while the first wire clamper 3, which is installed beneath the second wire clamper 2, can be moved upward and downward together with the capillary 4.

After passing the wire through the capillary 4, a ball 1*a* is formed on the tip end of the wire 1 by the discharge of an electric torch 5 in step (b). Afterward, the electric torch 5 is moved in the direction indicated by an arrow.

Next, in step (c), the first wire clamper 3 is opened. As a result, the ball 1*a* is caused to contact the lower end of the capillary 4 by the action of the back tension applied to the wire 1. Then, in step (d), the capillary 4 and the first wire clamper 3 are lowered by a distance of L1. In step (e), the second wire clamper 2 is closed, and the capillary 4 and first wire clamper 3 are raised to their original positions; in other words, they are raised by a distance of L1. As a result, the wire 1 extends from the lower end of the capillary 4 for a distance of L1.

Figure 2B:
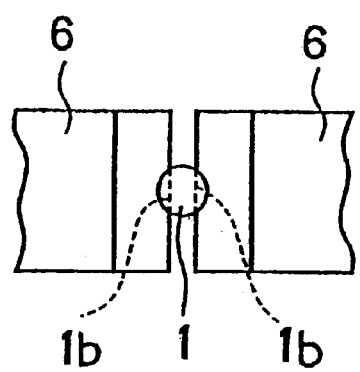

Then, in step (f), the first wire clamper 3 is closed and the second wire clamper 2 is opened, and a pair of cutters 6 (installed on the wire bonding apparatus) which are disposed at a distance of L2 beneath the lower end of the capillary 4 make a reciprocating motion and form notches 1*b* at the position where the wire 1 is to be cut. In this case, the cutters 6 come into contact with the wire 1 from opposite sides and bite into the wire by more or less equal amounts. Thus, the notches 1*b* are formed with more or less the same size in opposite positions (see FIG. 2.)

After the cutters 6 are withdrawn, in step (g), the first wire clamper 3 is opened, the capillary 4 and the first wire clamper 3 are lowered, and the ball 1*a* is pressed against an electrode pad 8 (a bonding object) of an electronic circuit element 7 such as an IC, LSI, etc. Next, an ultrasonic vibration is applied to the capillary 4 so that the ball 1*a* is bonded to the electrode pad 8.

Figure 3A:
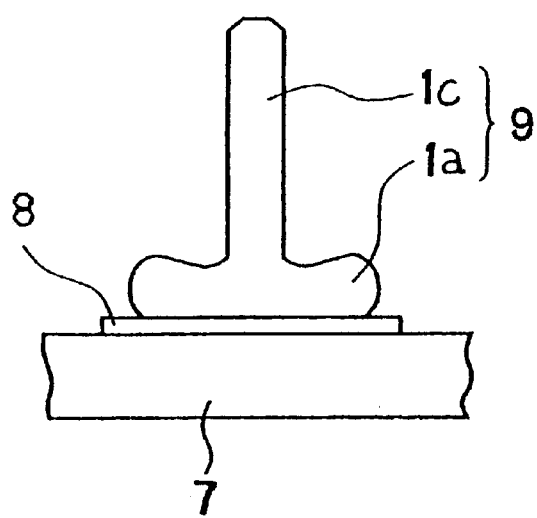
FIG. 3(*a*) is an enlarged view of portions of the pin-form wire shown in step (i) of FIG. 1, and FIG. 3(*b*) is a plan view of the tip end of the pin-form wire.
Figure 3B:

In next step (h), the capillary 4 and first wire clamper 3 are both raised, and the first wire clamper 3 is closed to hold the wire 1 and pull the wire 1 upward during this raising process. As a result, in step (i), the wire 1 is cut at the position where the notches 1*b* have been made (see step (h)). Since the notches 1*b* are formed with equal sizes in opposite positions on the wire 1, the cut surface is uniform without any variation (see FIG. 3). As a result, a pin-form wire or bump 9 is formed in step (i) and as shown in FIGS. 3(*a*) and 3(*b*). The length of the pin-form wire 1*c* is stable, and a fixed length L4 is obtained.

As seen from step (f), the step in which the notches 1*b* are formed in the wire 1 by the cutters 6 is performed before the capillary 4 is lowered and the ball 1*a* is bonded to the electrode pad 8. Accordingly, a sufficient space can be secured for the cutters 6 to be installed between the electrode pad 8 and the capillary 4, and there is no interference. Furthermore, even in cases where pin-form wires (or bumps) 9 of the type shown in step (i) are formed in a dense concentration, the cutters 6 operate above the pin-form wires (or bumps) 9, that is away from such pin-form wires or bumps 9, and the cutters do not contact the pin-form wires or bumps 9. Consequently, there are no restrictions on the portion of the wire 1 in which the notches 1*b* are formed, and it is possible to arbitrarily set the length of the wire 1*c*.

Furthermore, as a result of the employment the second wire clamper 2 that is immovable and stationary and as a result of closing this wire clamper 2, the wire 1 extends by a fixed distance of L1 from the lower end of the capillary 4 in step (e). Accordingly, the notches 1*b* can be formed in a predetermined position on the wire 1 in step (f). As a result, the length L3 from the ball 1*a* to the notches 1*b* can be a stable fixed quantity, and the length of the pin-form wire 9 (or the length of wire on the bump) formed in step (i) can be fixed. A stable fixed length L4 which is more or less equal to the length L3 is thus obtained.

In the above embodiment, notches 1*b* are formed by a pair of cutters 6 installed so as to face each other. However, it is also possible to use a single cutter 6 installed on one side and a stopping plate installed on another side of the wire. Furthermore, the present invention is not limited to a cutter(s) 6. Any other notch-forming means can be used in the present invention.

As seen from the above, in the present invention, a ball is formed on the tip end of a wire that passes through a capillary, the wire is then extended from the lower end of the capillary, a notch is formed in the portion of the wire so as to be between the ball and the capillary by a notch-forming means, then the ball is bonded to an electrode pad of an electronic circuit element, etc. using the capillary, the capillary is then raised, the wire is pulled upward so that the wire is cut at the notched portion, thus forming a pin-form wire or a bump. Accordingly, the wire length above the ball bonded can be set at an arbitrary value. Furthermore, there is no excessive increase in cost, the length of the pin-form wire is fixed, and a stable fixed length can be obtained.

What is claimed is:

1. A method for forming pin-form wires comprising the ordered steps of:

forming a ball on a tip end of a wire that passes through a capillary, extending said wire from a lower end of said capillary, forming a notch in a portion of said wire located between said ball and said capillary by a notch-forming means, bonding said ball to a bonding object using said capillary, raising said capillary, pulling said wire upward to cut said wire at said notch, thus forming said pin-form wire and the like.

2. A method for forming pin-form wires using a wire bonding apparatus which includes a first wire clamper that is movable upward and downward together with a capillary and a second wire clamper that is immovable upward or downward, said method comprising the steps of:

passing a wire through said second wire clamper, first wire clamper and capillary, forming a ball on a tip end of said wire passing through said capillary in a state in which said second clamper is open and said first clamper is closed, opening said first wire clamper, thus causing said ball to come into contact with a lower end of said capillary by an action of a back tension applied to said wire, lowering said capillary and said first wire clamper, raising said capillary and said first wire clamper after closing said second wire clamper so that said wire is caused to extend from said lower end of said capillary, forming a notch in a portion of said wire between said ball and said capillary by a notch-forming means in a state in which said first wire clamper is closed and said second wire clamper is open, opening said first wire clamper, and lowering said capillary and said first wire clamper to bond said ball to a bonding object using said capillary, raising said capillary and said first wire clamper, closing said first wire clamper during said step of raising said capillary and said first wire clamper, thus pulling said wire upward and cutting said wire at said notch, and forming said pin-form wire and the like.

3. The method for forming pin-form wires according to claim 1, wherein said bonding object is an electrode pad of an electronic circuit element.

4. The method for forming pin-form wires according to claim 2, wherein said bonding object is an electrode pad of an electronic circuit element.

* * * * *